(12) United States Patent
Gan et al.

(10) Patent No.: US 11,114,548 B2
(45) Date of Patent: Sep. 7, 2021

(54) SEMICONDUCTOR DEVICE HAVING SOURCE AND DRAIN IN ACTIVE REGION AND MANUFACTURING METHOD FOR SAME

(71) Applicants: Semiconductor Manufacturing International (Shanghai) Corporation, Shanghai (CN); Semiconductor Manufacturing International (Beijing) Corporation, Beijing (CN)

(72) Inventors: Zhenghao Gan, Shanghai (CN); Junhong Feng, Shanghai (CN)

(73) Assignees: Semiconductor Manufacturing (Shanghai) International Corporation, Shanghai (CN); Semiconductor Manufacturing (Beijing) International Corporation, Beijing (CN)

( * ) Notice: Subject to any disclaimer, the term of this patent is extended or adjusted under 35 U.S.C. 154(b) by 0 days.

(21) Appl. No.: 16/658,446

(22) Filed: Oct. 21, 2019

(65) Prior Publication Data
US 2020/0052093 A1 Feb. 13, 2020

Related U.S. Application Data

(62) Division of application No. 15/995,265, filed on Jun. 1, 2018, now Pat. No. 10,490,652.

(30) Foreign Application Priority Data

Jun. 5, 2017 (CN) .......................... 201710413178.2

(51) Int. Cl.
*H01L 29/66* (2006.01)
*H01L 29/16* (2006.01)
*G11C 11/412* (2006.01)
*H01L 29/06* (2006.01)
*H01L 27/11* (2006.01)
(Continued)

(52) U.S. Cl.
CPC ...... *H01L 29/66659* (2013.01); *G11C 11/412* (2013.01); *G11C 11/419* (2013.01);
(Continued)

(58) Field of Classification Search
None
See application file for complete search history.

(56) References Cited

U.S. PATENT DOCUMENTS 6,838,396 B2 * 1/2005 Burnham ............. H01L 29/513
438/783
7,118,954 B1 * 10/2006 Lin ................. H01L 21/823462
438/201
(Continued)

*Primary Examiner* — Andres Munoz

(57) ABSTRACT

The present disclosure relates to the field of semiconductor technologies, and discloses semiconductor devices and manufacturing methods for the same. A semiconductor device may include: a substrate; a first active region on the substrate; a first gate structure positioned on the first active region; and a first source and a first drain that are positioned in the first active region and respectively on two sides of the first gate structure, where a size of the first drain is larger than a size of the first source. In forms of the present disclosure, because the size of the first drain is larger than the size of the first source, a current from the first drain to the first source is greater than a current from the first source to the first drain, so that the semiconductor device can make a read current relatively low and a write current relatively high in a static random access memory (SRAM), thereby improving a read margin and a write margin.

4 Claims, 12 Drawing Sheets

(51) Int. Cl.

| | | |
|---|---|---|
| *H01L 29/08* | (2006.01) | |
| *G11C 11/419* | (2006.01) | |
| *H01L 29/78* | (2006.01) | |
| *H01L 21/8234* | (2006.01) | |
| *H01L 21/3065* | (2006.01) | |
| *H01L 21/8238* | (2006.01) | |
| *H01L 29/165* | (2006.01) | |

(52) U.S. Cl.
CPC .. *H01L 21/823418* (2013.01); *H01L 27/1104* (2013.01); *H01L 29/0649* (2013.01); *H01L 29/0847* (2013.01); *H01L 29/1608* (2013.01); *H01L 29/6653* (2013.01); *H01L 29/66636* (2013.01); *H01L 29/7848* (2013.01); *H01L 21/3065* (2013.01); *H01L 21/823814* (2013.01); *H01L 29/165* (2013.01); *H01L 29/6656* (2013.01)

(56) References Cited

U.S. PATENT DOCUMENTS

| | | | |
|---|---|---|---|
| 7,534,689 B2 * | 5/2009 | Pal | H01L 29/045 257/E21.202 |
| 8,975,703 B2 | 3/2015 | Gan | |
| 9,412,859 B2 * | 8/2016 | Richter | H01L 29/78 |
| 9,761,690 B2 * | 9/2017 | Hsu | H01L 29/511 |
| 2006/0043498 A1 * | 3/2006 | Orlowski | H01L 29/0847 257/396 |
| 2006/0046406 A1 | 3/2006 | Chindalore | |
| 2007/0187767 A1 | 8/2007 | Yasutake | |
| 2008/0076214 A1 * | 3/2008 | Han | H01L 29/78 438/197 |
| 2008/0119031 A1 * | 5/2008 | Pal | H01L 29/66636 438/483 |
| 2008/0199999 A1 | 8/2008 | Weijtmans | |
| 2008/0233691 A1 | 9/2008 | Cheng | |
| 2009/0020830 A1 | 1/2009 | Anderson | |
| 2009/0085123 A1 | 4/2009 | Sato | |
| 2009/0263949 A1 | 10/2009 | Anderson | |
| 2010/0012975 A1 | 1/2010 | Pal | |
| 2010/0081244 A1 | 4/2010 | Papageorgiou | |
| 2010/0163939 A1 | 7/2010 | Kronholz | |
| 2010/0181620 A1 * | 7/2010 | Booth, Jr. | H01L 29/792 257/350 |
| 2012/0256265 A1 * | 10/2012 | Fujimoto | H01L 21/823807 257/368 |
| 2014/0110791 A1 * | 4/2014 | Clark | H01L 29/517 257/369 |
| 2015/0243787 A1 | 8/2015 | Yan | |

* cited by examiner

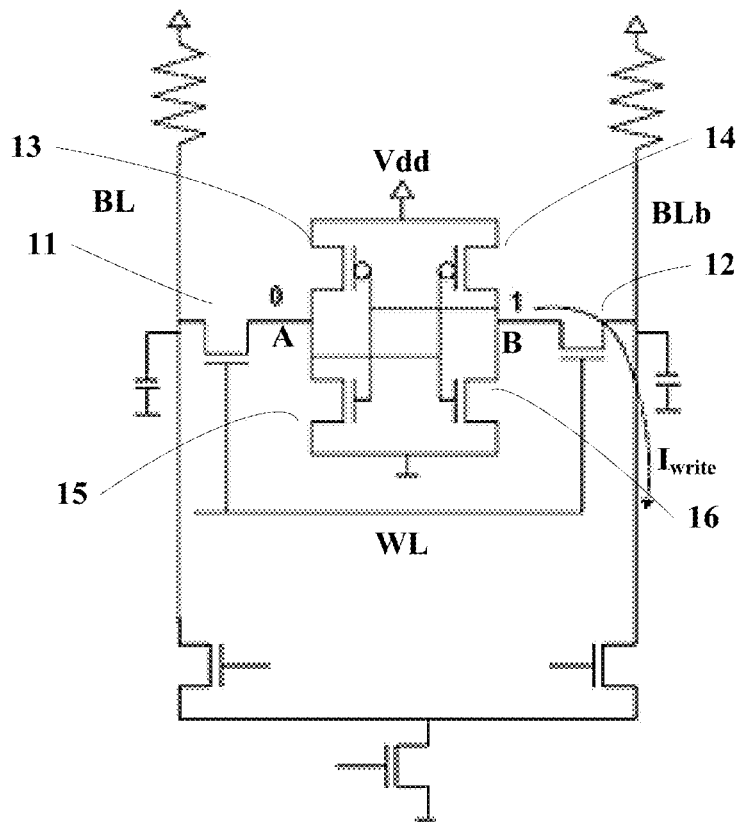

FIG. 1C

PRIOR ART

```
┌─────────────────────────────────────────────────┐
│ Provide a semiconductor structure, where the    │
│ semiconductor structure includes: a substrate,  │──── S201
│ a first active region on the substrate, and a   │
│ first gate structure on the first active region │
└─────────────────────────────────────────────────┘
                        │
                        ▼
┌─────────────────────────────────────────────────┐
│ Perform an etching process, to form a first     │
│ depression and a second depression that are in  │
│ the first active region and on two sides of the │──── S202
│ first gate structure respectively, where the    │
│ size of the second depression is larger than    │
│ the size of the first depression                │
└─────────────────────────────────────────────────┘
                        │
                        ▼
┌─────────────────────────────────────────────────┐
│ Form a first source in the first depression,    │
│ and form a first drain in the second depression,│──── S203
│ where the size of the first drain is larger     │
│ than the size of the first source               │
└─────────────────────────────────────────────────┘
```

FIG. 2

SEMICONDUCTOR DEVICE HAVING SOURCE AND DRAIN IN ACTIVE REGION AND MANUFACTURING METHOD FOR SAME

RELATED APPLICATIONS

The present application is a divisional of U.S. application Ser. No. 15/995,265, filed on Jun. 1, 2018 (still pending), which claims priority to Chinese Patent Appln. No. 201710413178.2, filed on Jun. 5, 2017, the entire disclosure of each of which is hereby incorporated by reference.

BACKGROUND

Technical Field

The present disclosure relates to the field of semiconductor technologies, and in particular, to semiconductor devices and manufacturing methods for the same.

Related Art

At present, in the advanced complementary metal oxide semiconductor (CMOS) technology, a static random access memory (SRAM) operated using Sub-1V (that is, a working voltage less than 1 V) faces problems caused by a decrease in the read/write stability. One of the root causes is contradictory requirements on read/write operations. FIG. 1A is a schematic circuit connection diagram of a 6-transistor-SRAM (6T-SRAM) in the prior art. FIG. 1A shows a first Pass Gate (PG) transistor 11, a second PG transistor 12, a first pull up (PU) transistor 13, a second PU transistor 14, a first pull down (PD) transistor 15, and a second PD transistor 16. In addition, FIG. 1A further shows internal nodes A and B, a bit line BL, a complementary bit line BLb, a word line WL, a supply voltage Vdd, and the like.

FIG. 1B shows a read current $I_{read}$ in a read operation process. For example, the read current $I_{read}$ flows from the bit line BL to a ground terminal through the first PG transistor 11 and the first PD transistor 15, so as to read data stored in the node A. FIG. 1C shows a write current $I_{write}$ in a write operation process. For example, the write current $I_{write}$ flows from the supply voltage Vdd to the complementary bit line BLb through the second PU transistor 14 and the second PG transistor 12, so that "1" originally stored in the node B can be written as "0", and "0" originally stored in the node A can be written as "1". Currently, when read and write operations are performed, it is necessary to improve the read margin and write margin of the SRAM, thereby improving the anti-interference capability thereof.

SUMMARY

One way to improve the read margin and the write margin of an SRAM is to make a current flowing through a PG transistor in a read operation (referred to as a read current) relatively low and a current flowing through the PG transistor in a write operation (referred to as a write current) relatively high. Herein, the read current is made relatively low to avoid interference to an SRAM unit during the read operation, and the write current is made relatively high, so that the write operation can be finished as quickly as possible, thereby improving an anti-interference capability of the SRAM. That is, a current from a bit line to an internal node (A or B) should be relatively low, and a current from the internal node (A or B) to the bit line should be relatively high. A drain of the PG transistor is connected to a bit line, and a source thereof is connected to an internal node; therefore, a current from the drain to the source should be greater than a current from the source to the drain.

A technical problem to be resolved by the present disclosure is to provide a semiconductor device, so that a current from a drain to a source of the semiconductor device is greater than a current from the source to the drain thereof.

In a first aspect of the present disclosure, a semiconductor device is provided, including: a substrate; a first active region on the substrate; a first gate structure positioned on the first active region; and a first source and a first drain that are positioned in the first active region and are on two sides of the first gate structure respectively, where a size of the first drain is larger than a size of the first source.

In some implementations, the size of the first drain includes a horizontal size of the first drain along a channel direction; and the size of the first source includes a horizontal size of the first source along the channel direction.

In some implementations, a conduction type of the first active region is N type, and a material of the first source and the first drain includes silicon germanium; or a conduction type of the first active region is P type, and a material of the first source and the first drain includes silicon carbide.

In some implementations, the semiconductor device further includes: a protective layer covering a surface of the first gate structure.

In some implementations, a material of the protective layer includes silicon nitride.

In some implementations, the first gate structure includes: a first gate dielectric layer positioned on the first active region and a first gate positioned on the first gate dielectric layer.

In some implementations, the semiconductor device further includes: spacers that are respectively positioned on two sides of the first gate structure and positioned on a side surface of the protective layer.

In some implementations, the semiconductor device further includes: spacers that are respectively positioned on side surfaces of two sides of the first gate structure.

In some implementations, the semiconductor device further includes: a second active region that is on the substrate and spaced from the first active region; a second gate structure positioned on the second active region; and a second source and a second drain that are positioned in the second active region and that are respectively positioned on two sides of the second gate structure, where a size of the second drain is equal to a size of the second source.

In some implementations, the second gate structure includes: a second gate dielectric layer positioned on the second active region and a second gate positioned on the second gate dielectric layer.

Forms of the above-described semiconductor device provided in the present disclosure has an asymmetric semiconductor structure. In the semiconductor device, a size of the first drain is larger than a size of the first source, so that the first drain has a greater stress on a channel than the first source. In this way, a current from the first drain to the first source is greater than a current from the first source to the first drain. After the semiconductor device is applied as a PG transistor in an SRAM, a read current in the SRAM is relatively low while a write current is relatively high, so that the read margin and the write margin can be improved.

In a second aspect of the present disclosure, a manufacturing method for a semiconductor device is provided. The method may include: providing a semiconductor structure, where the semiconductor structure includes: a substrate, a first active region on the substrate, and a first gate structure positioned on the first active region; performing an etching process, to form, in the first active region, a first depression and a second depression that are on two sides of the first gate structure respectively, where a size of the second depression is larger than a size of the first depression; and forming a first source in the first depression, and forming a first drain in the second depression, where a size of the first drain is larger than a size of the first source.

In some implementations, the size of the first depression includes a horizontal size of the first depression along a channel direction; the size of the second depression includes a horizontal size of the second depression along the channel direction; the size of the first drain includes a horizontal size of the first drain along the channel direction; and the size of the first source includes a horizontal size of the first source along the channel direction.

In some implementations, a conduction type of the first active region is N type, and a material of the first source and a material of the first drain includes silicon germanium; or a conduction type of the first active region is P type, and a material of the first source and a material of the first drain includes silicon carbide.

In some implementations, the method further includes: before the etching process is performed, forming a protective layer on the semiconductor structure, where the protective layer covers at least the first active region and the first gate structure; and during the etching process, etching a part of the protective layer on two sides of the first gate structure and a part of the first active region under the protective layer to form the first depression and the second depression.

In some implementations, a material of the protective layer includes silicon nitride.

In some implementations, the step of performing the etching process includes: forming a patterned mask layer on the protective layer, where the mask layer exposes a part of the protective layer that covers the first gate structure and covers a part of the first active region that is on two sides of the first gate structure; using the mask layer as a mask, and etching the exposed part of the protective layer on two sides of the first gate structure and the part of the first active region under the protective layer, thereby forming the first depression and the second depression; and removing the mask layer.

In some implementations, in the step of providing a semiconductor structure, the first gate structure includes: a first gate dielectric layer on the first active region and a first gate on the first gate dielectric layer.

In some implementations, after forming the first source and the first drain, the method further includes: forming spacers on two sides of the first gate structure respectively, where the spacers are on a side surface of the protective layer.

In some implementations, the method further includes: after forming the first source and the first drain, removing the protective layer; and after removing the protective layer, forming spacers on side surfaces on two sides of the first gate structure respectively.

In some implementations, in the step of providing a semiconductor structure, the semiconductor structure further includes: a second active region that is on the substrate and spaced from the first active region, and a second gate structure positioned on the second active region; and the method further includes: forming, in the second active region, a second source and a second drain that are on two sides of the second gate structure respectively, where a size of the second drain is equal to a size of the second source.

In some implementations, the second gate structure includes: a second gate dielectric layer on the second active region and a second gate on the second gate dielectric layer.

In forms of the above-described manufacturing method, the size of the second depression is made to be larger than the size of the first depression, so that after the first drain and the first source are formed in the two depressions respectively, the size of the first drain is larger than the size of the first source, and therefore, the first drain has a greater stress on a channel than the first source. In this way, a current from the first drain to the first source is greater than a current from the first source to the first drain. After the semiconductor device is applied as a PG transistor in an SRAM, a read current in the SRAM is relatively low while a write current is relatively high, so that the read margin and the write margin can be improved.

The exemplary embodiments and forms of the present disclosure are described in detail below with reference to the accompanying drawings, so that other features and advantages of the present invention become clear.

BRIEF DESCRIPTION OF THE DRAWINGS

The accompanying drawings, as a part of the specification, illustrate embodiments and implementations of the present disclosure and, together with the description, serve to explain the principles of the present disclosure.

With reference to the accompanying drawings, the present disclosure may be understood more clearly according to the following detailed description, where:

FIG. 1C is a schematic circuit connection diagram when a 6T-SRAM in the prior art performs a write operation;

FIG. 2 is a schematic flowchart of one form of a manufacturing method for a semiconductor device;

DETAILED DESCRIPTION

Various exemplary embodiments and forms of the present disclosure are described in detail with reference to the accompanying drawings. It should be noted that unless otherwise specified, relative layouts, mathematical expressions, and numeric values of components and steps described in these embodiments do not limit the scope of the present disclosure.

Meanwhile, it should be understood that for ease of description, sizes of the parts shown in the accompanying drawings are not drawn according to an actual proportional relation.

The following description about at least one exemplary embodiment or form is for illustrative purposes only, and should not be used as any limitation on the present disclosure or the application or use thereof.

Technologies, methods, and devices that are known by a person of ordinary skill in the related fields may not be discussed in detail. However, in proper cases, the technologies, methods, and devices should be considered as a part of the authorized specification.

In all examples shown and discussed herein, any specific value should be interpreted as exemplary only rather than a limitation. Therefore, other exemplary embodiments may have different values.

It should be noted that similar reference signs and letters represent similar items in the following accompanying drawings. Therefore, once an item is defined in a figure, the item does not need to be further discussed in the subsequent figures.

Figure 1A:
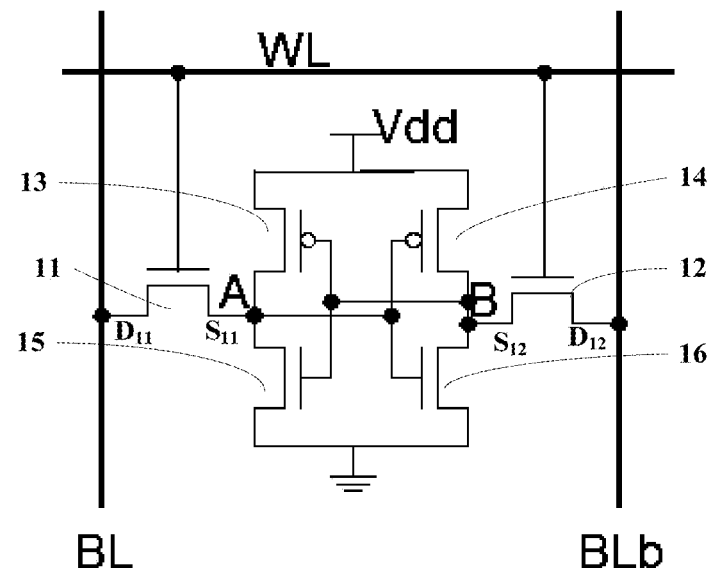
FIG. 1A is a schematic circuit connection diagram of a 6T-SRAM in the prior art.
Figure 1B:
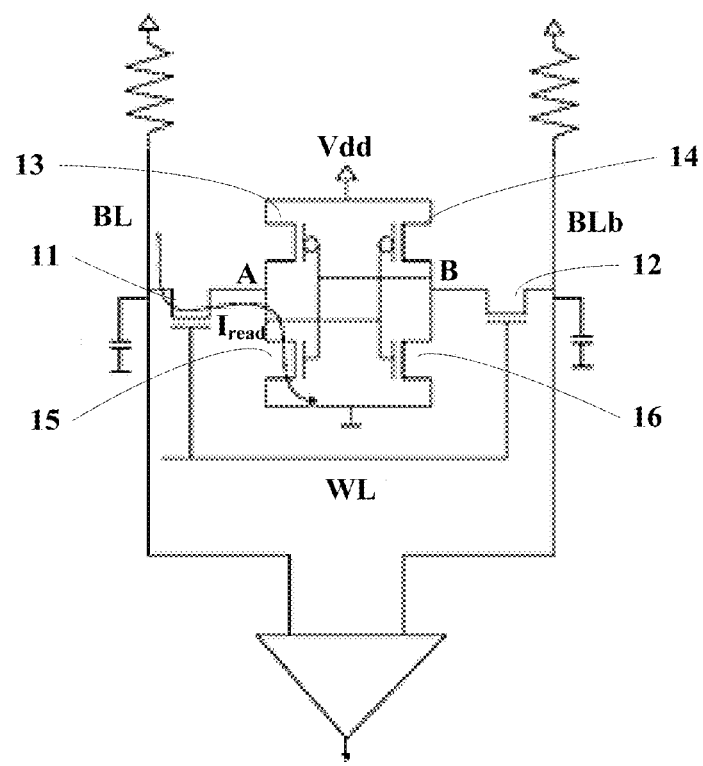
FIG. 1B is a schematic circuit connection diagram when a 6T-SRAM in the prior art performs a read operation.

In order to improve a read margin and a write margin of an SRAM, it is desirable to make a current flowing through a PG transistor in a read operation (referred to as a read current) relatively low and a current flowing through the PG transistor in a write operation (referred to as a write current) relatively high. Herein, the read current is made relatively low to avoid interference to an SRAM unit during the read operation, and the write current is made relatively high, so that the write operation can be finished as quickly as possible. That is, a current from a bit line to an internal node (A or B) should be relatively low, and a current from the internal node (A or B) to the bit line should be relatively high. A drain of the PG transistor is connected to a bit line (for example, as shown in FIG. 1A, a drain $D_{11}$ of a first PG transistor is connected to a bit line BL, and a drain $D_{12}$ of a second PG transistor is connected to a complementary bit line BLb), and a source thereof is connected to an internal node (for example, as shown in FIG. 1A, a source $S_{11}$ of the first PG transistor is connected to a node A, and a source $S_{12}$ of the second PG transistor is connected to a node B); therefore, a current from the drain to the source should be greater than a current from the source to the drain.

FIG. 2 is a schematic flowchart of a manufacturing method of a semiconductor device.

In step S201, a semiconductor structure is provided, where the semiconductor structure includes: a substrate, a first active region on the substrate, and a first gate structure on the first active region. For example, the first gate structure may include: a first gate dielectric layer on the first active region and a first gate on the first gate dielectric layer.

In step S202, an etching process is performed, to form, in the first active region, a first depression and a second depression that are on two sides of the first gate structure, respectively, where a size of the second depression is larger than a size of the first depression.

In some implementations, the size of the first depression may include a horizontal size of the first depression along a channel direction; and the size of the second depression may include a horizontal size of the second depression along the channel direction A person skilled in art may understand that, when a device operates, a channel may be formed in a part of an active region (such as the first active region) under a gate structure (such as the first gate structure), and the channel direction may be a flow direction of a carrier.

In step S203, a first source is formed in the first depression, and a first drain is formed in the second depression, where a size of the first drain is larger than a size of the first source.

In some implementations, the size of the first drain may include a horizontal size of the first drain along the channel direction; and the size of the first source may include a horizontal size of the first source along the channel direction. Certainly, the scope of the present disclosure is not limited thereto. For example, the size of the first drain and the size of the first source may also be a size in another direction, such as a horizontal size perpendicular to the channel.

In forms of the foregoing embodiment, a size of the second depression is made to be larger than a size of the first depression, so that after the first drain and the first source are formed in the two depressions, respectively, the size of the first drain is larger than the size of the first source, and therefore, the first drain has a greater stress on a channel than the first source. In this way, a current from the first drain to the first source is greater than a current from the first source to the first drain.

After the semiconductor device is applied as a PG transistor in an SRAM, a read current in the SRAM is relatively low while a write current is relatively high, so that the read margin (i.e., the read signal noise margin, the read SNM for short) and the write margin can be improved. Higher read margin and write margin of the SRAM indicate a stronger anti-interference capability thereof.

In some implementations, a conduction type of the first active region is N type (that is, the formed semiconductor device may be a P-channel metal oxide semiconductor (PMOS) device), and a material of the first source and the first drain may include silicon germanium. In other implementations, a conduction type of the first active region may be P type (that is, the formed semiconductor device may be an N-channel metal oxide semiconductor (NMOS) device), and a material of the first source and the first drain may include silicon carbide.

FIG. 3A to FIG. 3I are schematic cross-section diagrams of structures in several stages in a manufacturing process of a semiconductor device according to some forms of the present disclosure. A manufacturing process of a semiconductor device is described in detail with reference to FIG. 3A to FIG. 3I.

Figure 3A:
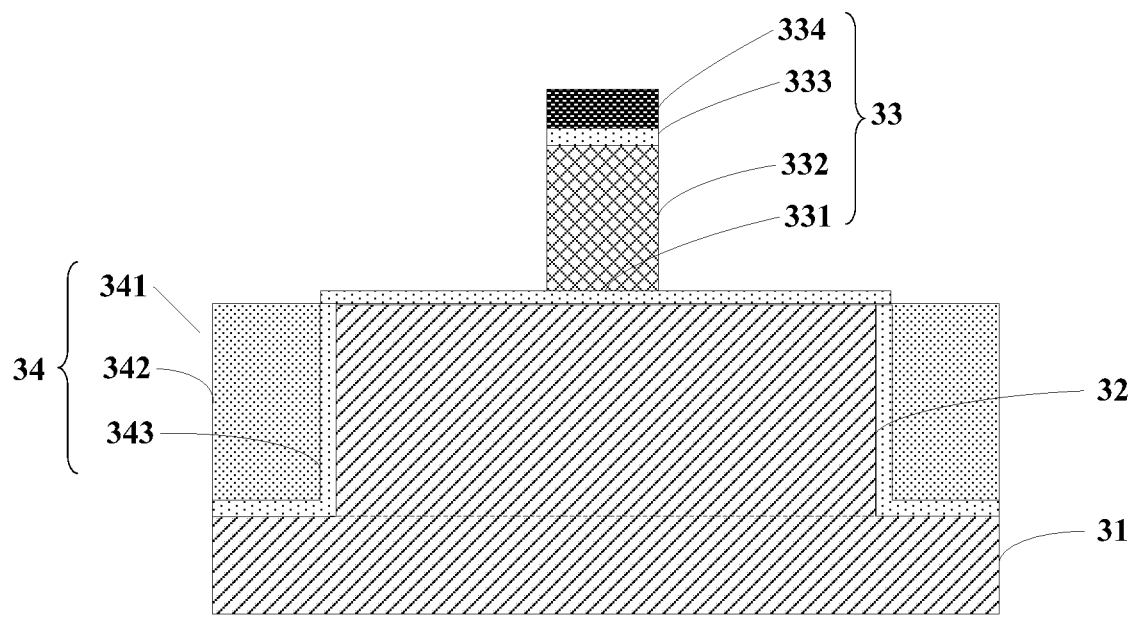
FIG. 3A to FIG. 3I are schematic cross-section diagrams of structures in several stages in a manufacturing process of a semiconductor device according to some forms of the present disclosure.

First, as shown in FIG. 3A, a semiconductor structure is provided, where the semiconductor structure may include: a substrate (such as a silicon substrate) 31, a first active region 32 on the substrate 31, and a first gate structure 33 on the first active region 32. It should be noted that, the dashed line in the figure is merely used to facilitate the description, and the dashed line does not necessarily exist in reality.

In some implementations, as shown in FIG. 3A, the first gate structure 33 may include: a first gate dielectric layer 331 on the first active region 32 and a first gate 332 on the first gate dielectric layer 331. For example, a material of the first gate dielectric layer 331 may include: silicon dioxide or a high-dielectric-constant material (such as hafnium dioxide ($HfO_2$) or zirconium dioxide ($ZrO_2$)). A material of the first gate 332 may include: polycrystalline silicon or metal such as tungsten. It should be noted that, in some implementations, a part of a dielectric layer that is under the first gate and in direct contact with the first gate may be used as the first gate dielectric layer. In other implementations, the entire dielectric layer formed on the upper surface of the first active region may be used as the first gate dielectric layer. Therefore, the scope of the present disclosure is not limited thereto.

In some implementations, in the step of providing a semiconductor structure, as shown in FIG. 3A, the first gate structure 33 may further include: a first buffer layer (such as silicon dioxide) 333 on the first gate 332 and a first hard mask layer (such as silicon nitride) 334 on the first buffer layer 333. The buffer layer (such as the first buffer layer) may buffer impact of a high stress from a hard mask layer (such as the first hard mask layer) on a gate (such as the first gate).

In some implementations, in the step of providing a semiconductor structure, as shown in FIG. 3A, the semiconductor structure may further include: a groove isolation portion 34 that is on the substrate 31 and around the first active region 32. The groove isolation portion 34 may include: a groove 341 around the first active region 32 and a groove insulator layer (such as silicon dioxide) 342 filled in the groove 341. Optionally, the groove isolation portion 34 may further include: a lining layer (such as silicon dioxide) 343 that is between the groove insulator layer 342 and the substrate 31 as well as the first active region 32.

Figure 3B:
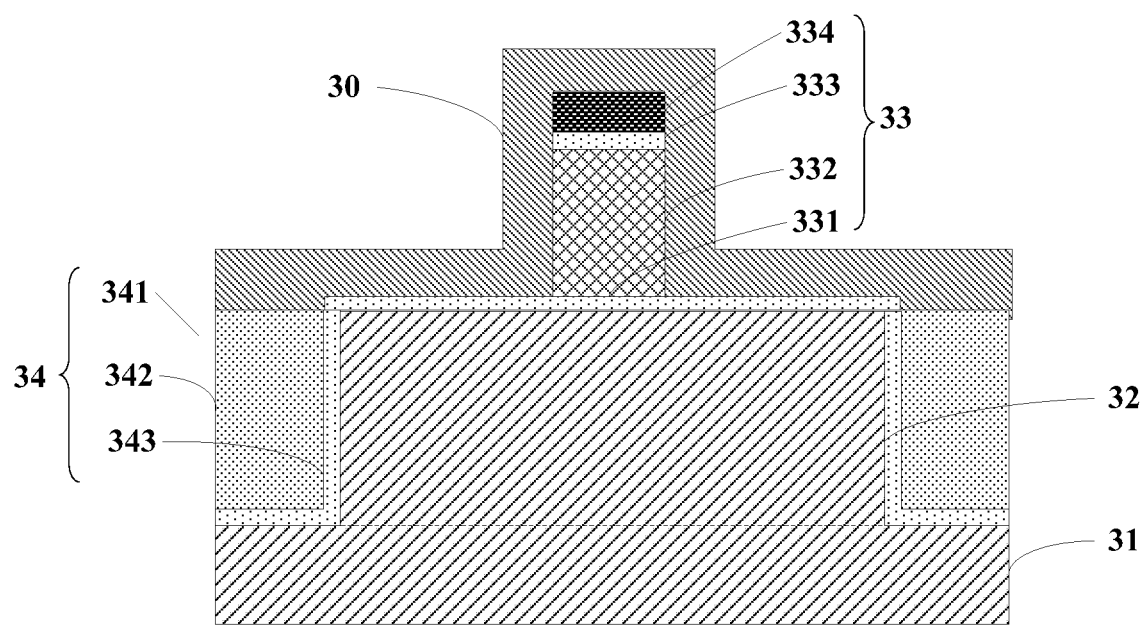

Next, as shown in FIG. 3B, a protective layer 30 is formed on the semiconductor structure shown in FIG. 3A by means of, for example, a deposition process. The protective layer 30 covers at least the first active region 32 and the first gate structure 33. For example, a material of the protective layer 30 may include silicon nitride.

Next, an etching process is performed, to form, in the first active region, a first depression and a second depression that are on two sides of the first gate structure respectively. The process of forming the first depression and the second depression is described below with reference to FIG. 3C to FIG. 3D.

Figure 3C:
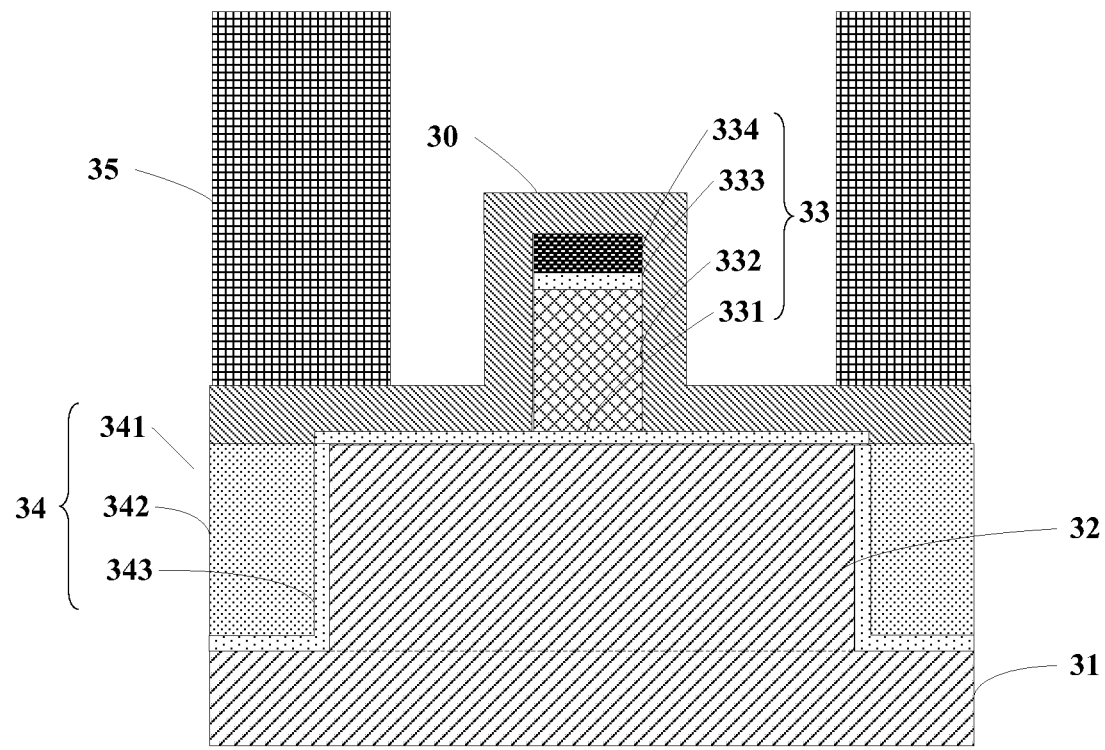

As shown in FIG. 3C, the step of performing the etching process may include: forming a patterned mask layer (such as a photoresist) 35 on the protective layer 30. The mask layer 35 exposes a part of the protective layer 30 that covers the first gate structure 33 and covers a part of the first active region 32 (that is, the part used for forming the source and the drain subsequently) that is on two sides of the first gate structure 33 (such as the first gate of the first gate structure).

Figure 3D:
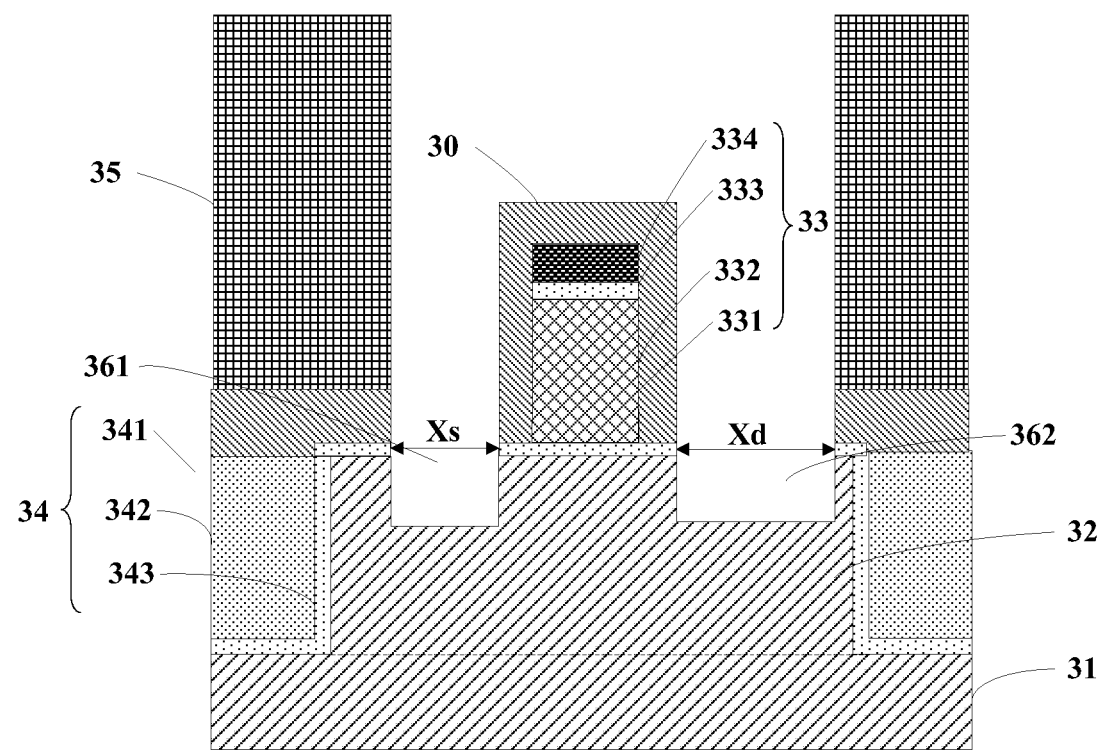

Next, as shown in FIG. 3D, the step of performing the etching process may further include: using the mask layer 35 as a mask, and etching the exposed part of the protective layer 30 on two sides of the first gate structure (such as the first gate of the first gate structure) and the part of the first active region 32 under the protective layer 30, thereby forming the first depression 361 and the second depression 362. The size Xd of the second depression 362 is larger than the size Xs of the first depression 361. The protective layer 30 can prevent the first gate from being damaged in the etching step, and can also protect the first gate from impact of other subsequent processes. Optionally, as shown in FIG. 3D, the etching process may further remove a part of the first gate dielectric layer on two sides of the first gate.

Figure 3E:
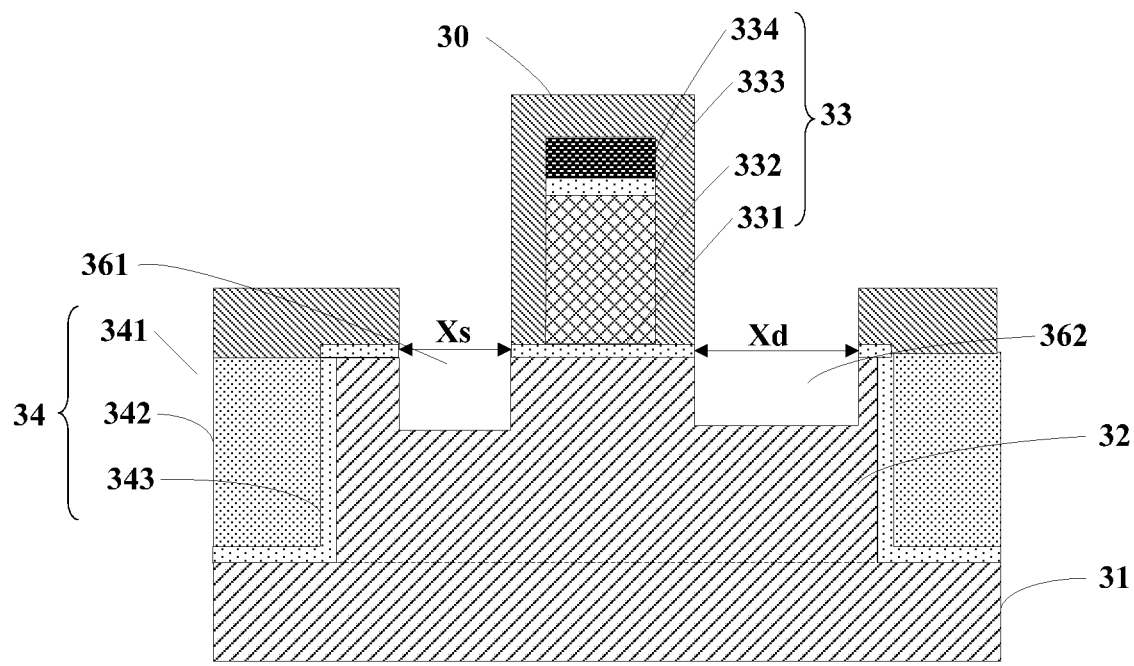

Next, as shown in FIG. 3E, the step of performing the etching process may further include: removing the mask layer 35.

Heretofore, the etching process has been performed. During the etching process, the part of the protective layer 30 on two sides of the first gate structure 33 (such as the first gate of the first gate structure) and the part of the first active region 32 under the protective layer 30 are etched, thereby forming the first depression and the second depression. The size of the second depression is larger than the size of the first depression.

Figure 3F:
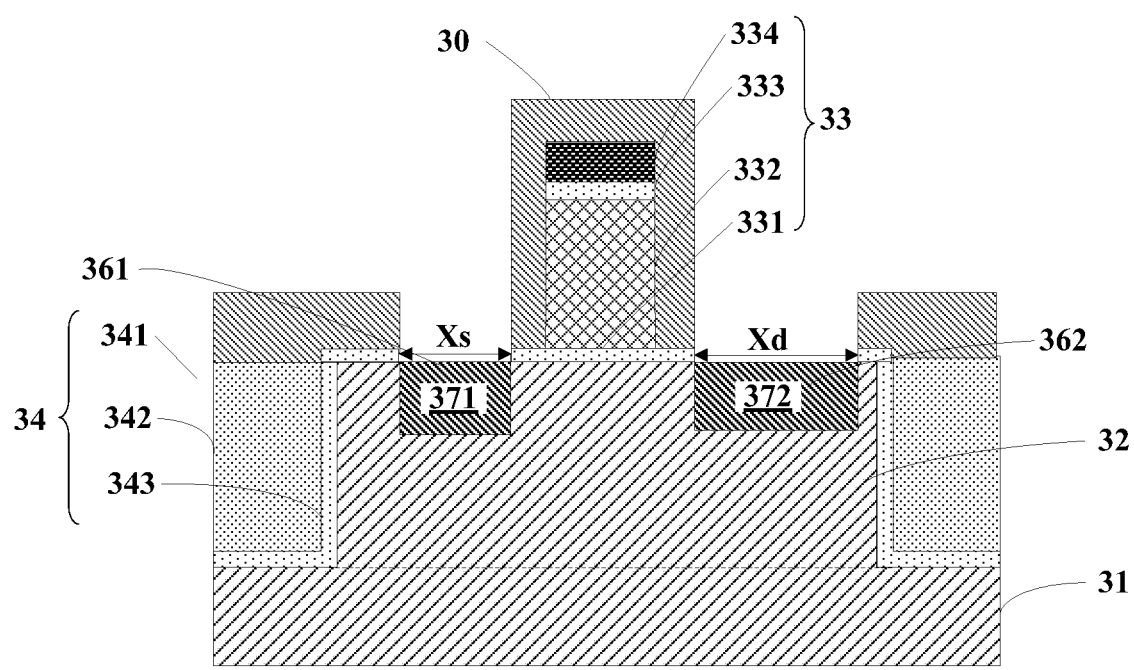

Next, as shown in FIG. 3F, by means of an epitaxy process, a first source 371 is formed in the first depression 361 and a first drain 372 is formed in the second depression 362. The size Xd of the first drain 372 is larger than the size Xs of the first source 371.

In some implementations, a conduction type of the first active region 32 may be N type, and a material of the first source 371 and the first drain 372 may include silicon germanium. In other implementations, a conduction type of the first active region 32 may be P type, and a material of the first source 371 and the first drain 372 may include silicon carbide.

Figure 3G:
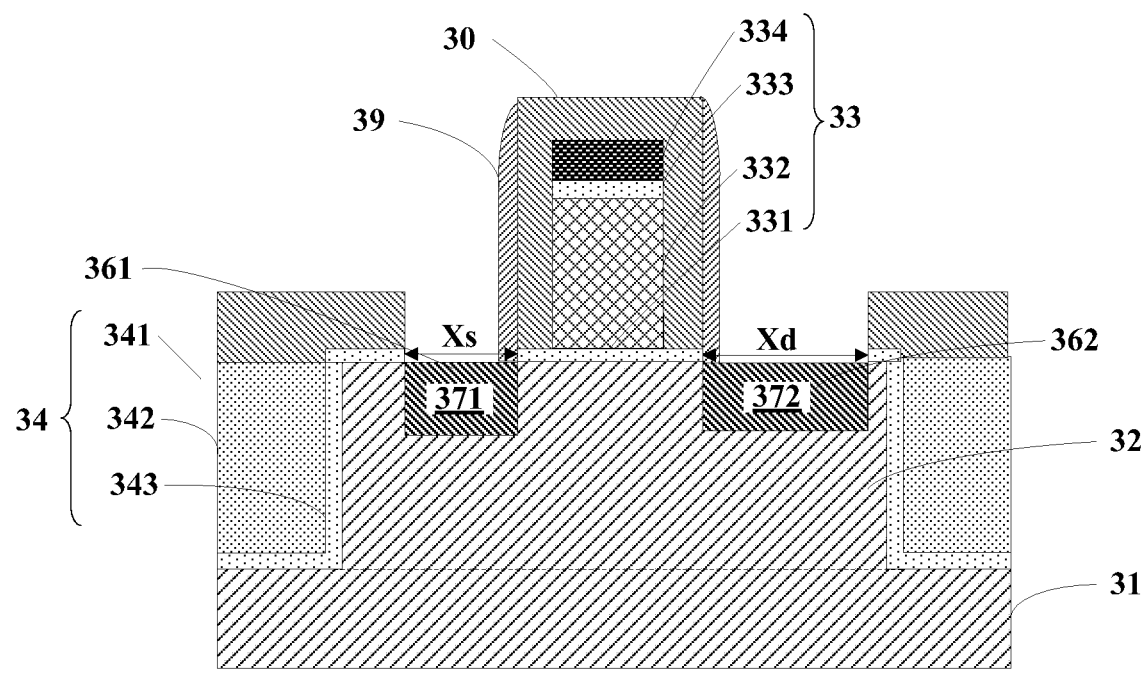

In some implementations, after the first source 371 and the first drain 372 are formed, the manufacturing method may further include: as shown in FIG. 3G, for example, forming spacers 39 that are on two sides of the first gate structure 33 respectively by means of a deposition process and an etching process, where the spacers 39 are on a side surface of the protective layer 30. A material of the spacers 39 may include silicon dioxide or silicon nitride.

Figure 3H:
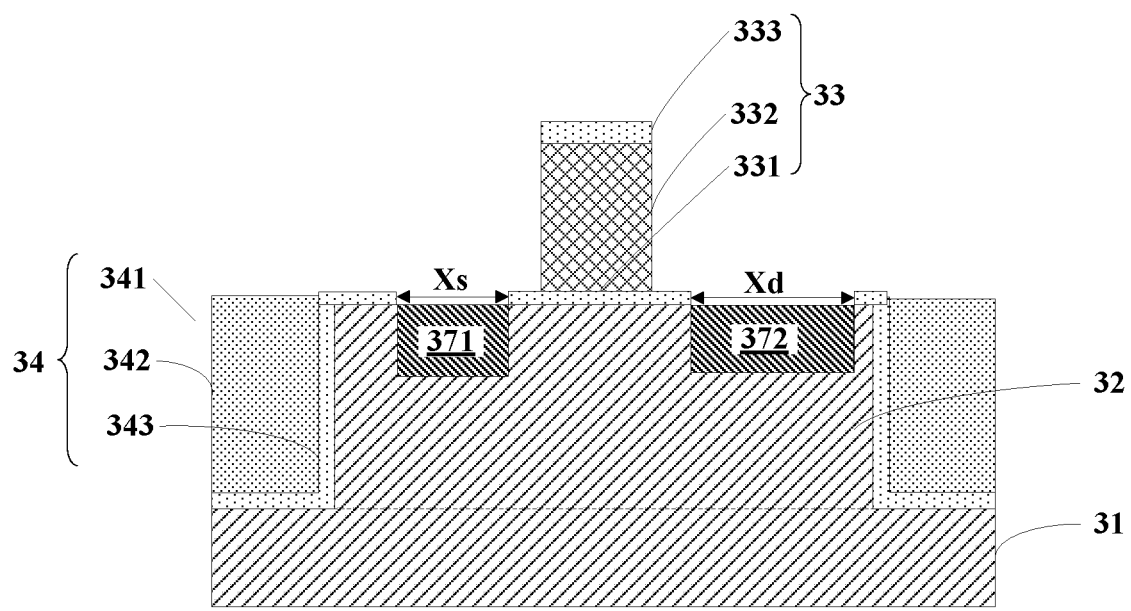
Figure 3I:
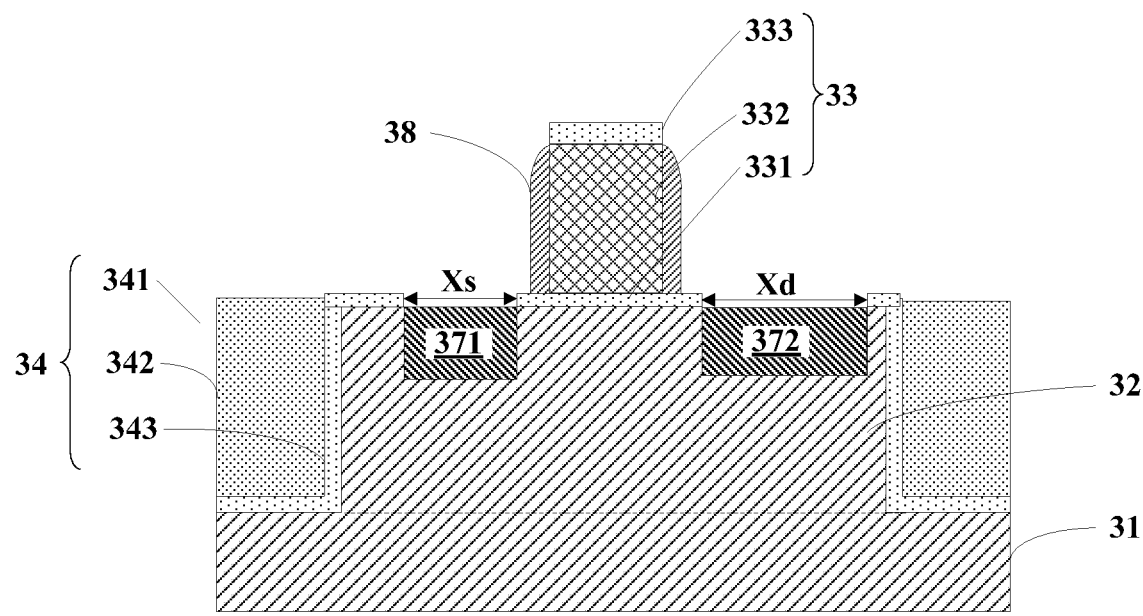

In some implementations, after the first source 371 and the first drain 372 are formed, the manufacturing method may further include: as shown in FIG. 3H, removing the protective layer 30. In some implementations, in the step of removing the protective layer 30, the first hard mask layer 334 is also removed. After the protective layer 30 is removed, as shown in FIG. 3I, spacers 38 are formed on side surfaces on two sides of the first gate structure 33 (such as the first gate 332 of the first gate structure 33), respectively, by mean of, for example, a deposition process and an etching process. A material of the spacers 38 may include silicon dioxide or silicon nitride.

Heretofore, forms of a manufacturing method for a semiconductor device are provided.

Based on a manufacturing method such as those described above, a semiconductor device is formed. For example, as shown in FIG. 3G, the semiconductor device may include: a substrate 31; a first active region 32 on the substrate 31; a first gate structure 33 on the first active region 32; and a first source 371 and a first drain 372 that are in the first active region and on two sides of the first gate structure 33 respectively. The size Xd of the first drain 372 is larger than the size Xs of the first source 371.

In some implementations, the size of the first drain 372 may include a horizontal size of the first drain 372 along a channel direction; the size of the first source 371 may include a horizontal size of the first source 371 along the channel direction. A person skilled in the art may understand that, when a device works, a channel may be formed in a part of an active region (such as the first active region) under a gate structure (such as the first gate structure) and between a source (such as the first source) and a drain (such as the first drain). The channel direction may be a flow direction of a carrier (such as an electron or a hole).

The above semiconductor device has an asymmetric semiconductor structure. In the semiconductor device, the size of the first drain is larger than the size of the first source, so that the first drain has a greater stress on a channel than the first source. In this way, a current from the first drain to the first source is greater than a current from the first source to the first drain. After the semiconductor device is applied as a PG transistor in an SRAM, a read current in the SRAM is relatively low while a write current is relatively high, so that the read margin and the write margin can be improved.

In some implementations, a conduction type of the first active region 32 may be N type (that is, the semiconductor device may be a PMOS device), and a material of the first source 371 and the first drain 372 may include silicon germanium. In other implementations, a conduction type of the first active region 32 may be P type (that is, the semiconductor device may be an NMOS device), and a material of the first source 371 and the first drain 372 may include silicon carbide.

In some implementations, as shown in FIG. 3G, the first gate structure 33 may include: a first gate dielectric layer 331 on the first active region 32 and a first gate 332 on the first gate dielectric layer 331. In some implementations, the first gate structure 33 may further include: a first buffer layer 333 on the first gate 332. Optionally, the first gate structure 33 may further include: a first hard mask layer 334 on the first buffer layer 333.

In some implementations, as shown in FIG. 3G, the semiconductor device may further include: a protective layer 30 that covers a surface of the first gate structure 33. For example, a material of the protective layer 30 may include silicon nitride.

In some implementations, as shown in FIG. 3G, the semiconductor device may further include: spacers 39 that are on two sides of the first gate structure 33 respectively, where the spacers 3 are on a side surface of the protective layer 30.

In some implementations, as shown in FIG. 3G, the semiconductor device may further include: a groove isolation portion 34 that is on the substrate 31 and around the first active region 32. The groove isolation portion 34 may include: a groove 341 around the first active region 32 and a groove insulator layer 342 filled in the groove 341. Optionally, the groove isolation portion 34 may further include: a lining layer 343 that is between the groove insulator layer 342 and the substrate 31 as well as the first active region 32.

Based on a manufacturing method according to another form of the present disclosure, another form of a semiconductor device is formed, as shown in FIG. 3I. Here, structures that are included in the semiconductor device shown in FIG. 3I and the same as, or similar to, those shown in FIG. 3G are not described in detail again. One of the differences between the semiconductor device shown in FIG. 3I and the semiconductor device shown in FIG. 3G is that, the semiconductor device shown in FIG. 3I does not include the protective layer 30, and the spacers are directly formed on the side surfaces on two sides of the first gate structure. That is, as shown in FIG. 3I, the semiconductor device includes: spacers 38 that are on side surfaces on two sides of the first gate structure 33 respectively. In addition, compared with FIG. 3G, the first gate structure 33 shown in FIG. 3I does not include the first hard mask layer 334.

In some implementations, the semiconductor device (shown in FIG. 3G or FIG. 3I) may be a fin-type semiconductor device, or may be a plane-type semiconductor device.

FIG. 4A to FIG. 4M are schematic cross-section diagrams of structures in several stages in a manufacturing process of a semiconductor device according to some other forms of the present disclosure. The manufacturing process of a semiconductor device according to some other embodiments of the present disclosure is described in detail below with reference to FIG. 4A to FIG. 4M.

Figure 4A:
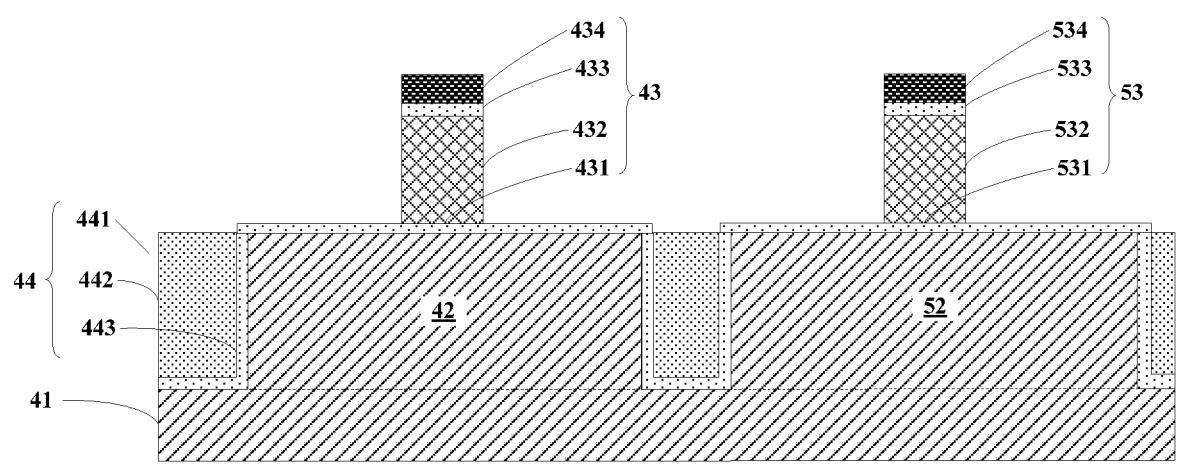
FIG. 4A to FIG. 4M are schematic cross-section diagrams of structures in several stages in a manufacturing process of a semiconductor device according to some other forms of the present disclosure.

First, as shown in FIG. 4A, a semiconductor structure is provided. The semiconductor structure may include: a substrate (such as silicon substrate) 41, a first active region 42 on the substrate 41, and a first gate structure 43 on the first active region 42. In some implementations, the first gate structure 43 may include: a first gate dielectric layer 431 on the first active region 42 and a first gate 432 on the first gate dielectric layer 431. For example, a material of the first gate dielectric layer 431 may include: silicon dioxide or a high-dielectric-constant material (such as $HfO_2$ or $ZrO_2$). A material of the first gate 432 may include: polycrystalline silicon or metal such as tungsten.

Optionally, in the step of providing a semiconductor structure, as shown in FIG. 4A, the first gate structure 43 may further include: a first buffer layer (such as silicon dioxide) 433 on the first gate 432 and a first hard mask layer (such as silicon nitride) 434 on the first buffer layer 433. The first buffer layer may buffer impact of a high stress from the first hard mask layer on the first gate.

In some implementations, in the step of providing a semiconductor structure, as shown in FIG. 4A, the semiconductor structure may further include: a second active region 52 that is on the substrate 41 and spaced from the first active region 42, and a second gate structure 53 on the second active region 52. For example, a conduction type of the second active region 52 may be the same as or opposite to a conduction type of the first active region 42.

As shown in FIG. 4A, the second gate structure 53 may include: a second gate dielectric layer 531 on the second active region 52 and a second gate 532 on the second gate dielectric layer 531. For example, a material of the second gate dielectric layer 531 may include: silicon dioxide or a high-dielectric-constant material (such as $HfO_2$ or $ZrO_2$). A material of the second gate 532 may include: polycrystalline silicon or metal such as tungsten. The material of the second gate 532 may be the same as or different from the material of the first gate 432.

In some implementations, in the step of providing a semiconductor structure, as shown in FIG. 4A, the second gate structure 53 may further include: a second buffer layer (such as silicon dioxide) 533 on the second gate 532 and a second hard mask layer (such as silicon nitride) 534 on the second buffer layer 533. The second buffer layer may buffer impact of a high stress from the second hard mask layer on the second gate.

In some implementations, in the step of providing a semiconductor structure, as shown in FIG. 4A, the semiconductor structure may further include: a groove isolation portion 44 that is on the substrate 41 and around the first active region 42 and the second active region 52. The groove isolation portion 44 may include: a groove 441 around the first active region 42 and the second active region 52, and a groove insulator layer (such as silicon dioxide) 442 filled in the groove 441. In some implementations, the groove isolation portion 44 may further include: a lining layer (such as silicon dioxide) 443 that is between the groove insulator layer 442 and the substrate 41, the first active region 42, as well as the second active region 52. As shown in FIG. 4A, a part of the groove isolation portion 44 isolates the first active region 42 from the second active region 52.

Figure 4B:
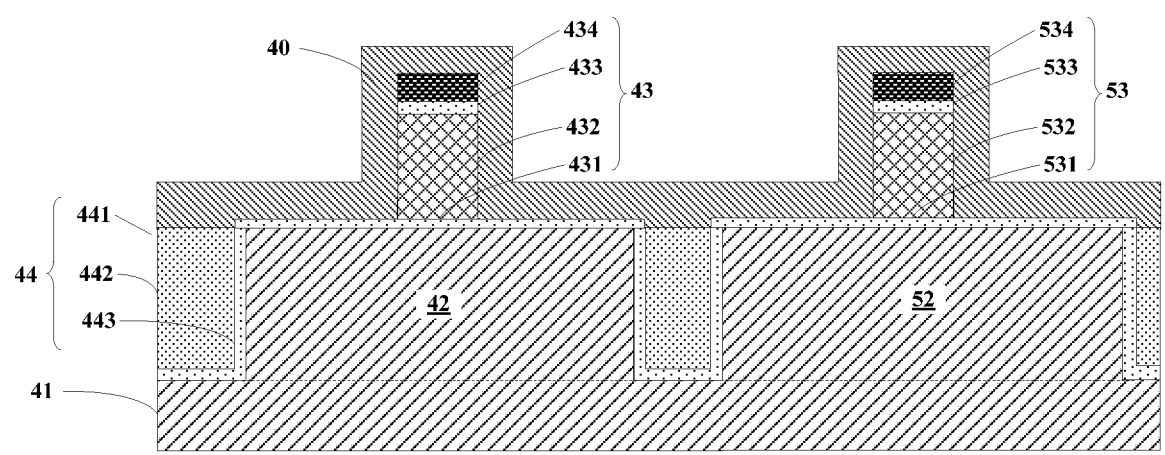

Next, as shown in FIG. 4B, a protective layer 40 is formed on the semiconductor structure shown in FIG. 4A by means of, for example, a deposition process. In addition to the first active region 42 and the first gate structure 43, the protective layer 40 further covers the second active region 52 and the second gate structure 53. For example, a material of the protective layer 40 may include silicon nitride.

Figure 4C:
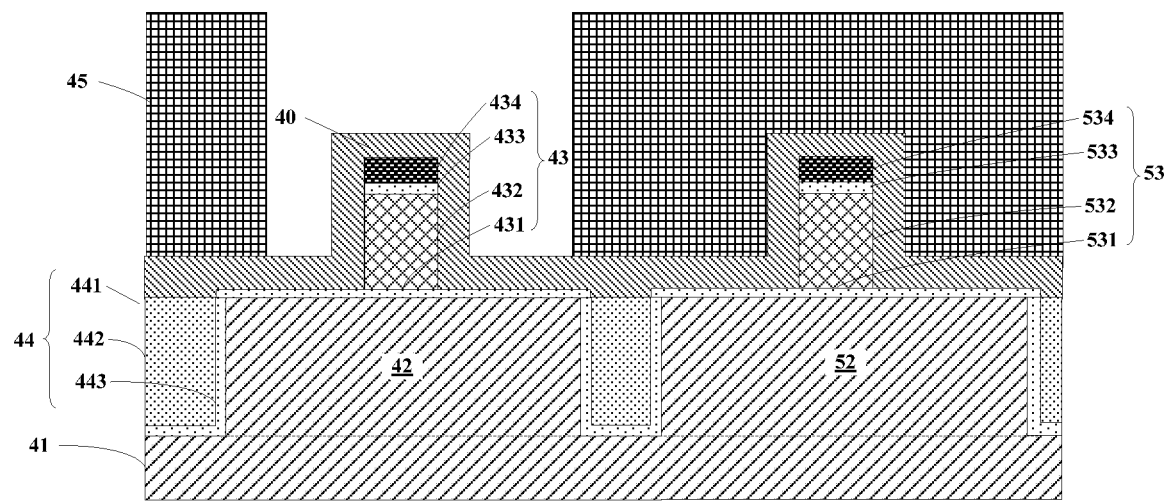

Next, as shown in FIG. 4C, a patterned mask layer (such as a photoresist) 45 is formed on the protective layer 40. The mask layer 45 exposes a part of the protective layer 40 that covers the first gate structure 43 and covers a part of the first active region 42 (that is, the part used for forming the source and the drain subsequently) that is on two sides of the first gate structure 43 (such as the first gate of the first gate structure).

Figure 4D:
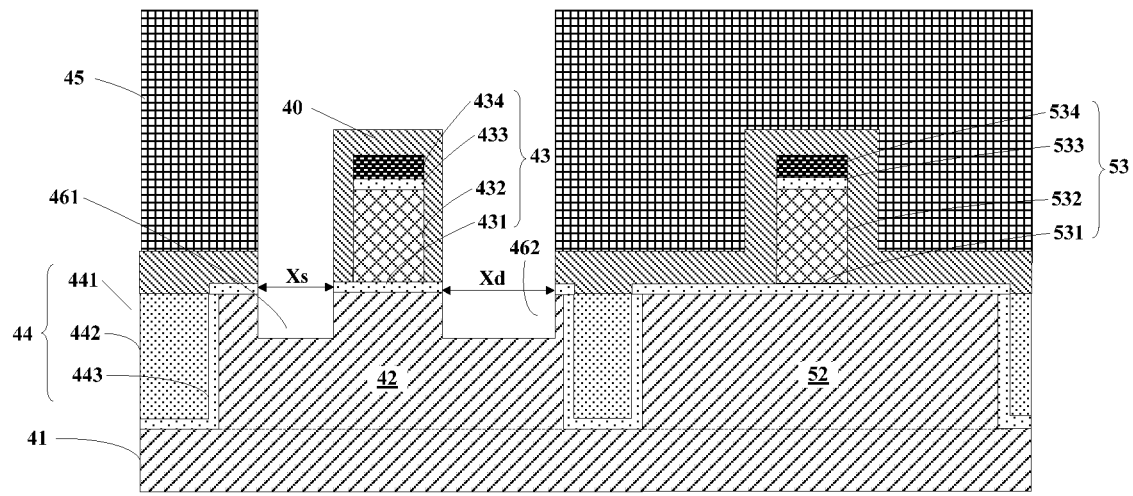
Figure 4E:
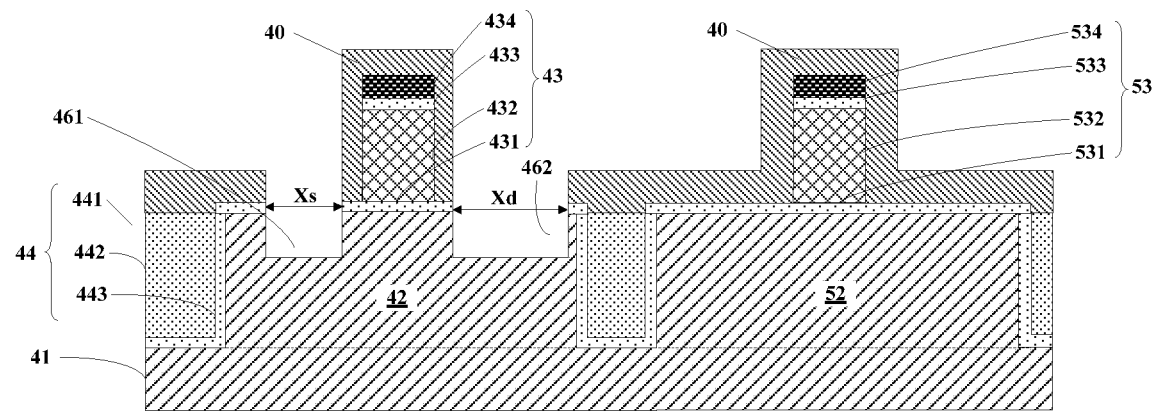

Next, as shown in FIG. 4D, the mask layer 45 is used as a mask, and the exposed part of the protective layer 40 on two sides of the first gate structure (such as the first gate of the first gate structure) and the part of the first active region 42 under the protective layer 40 are etched, thereby forming the first depression 461 and the second depression 462. The size Xd of the second depression 462 is larger than the size Xs of the first depression 461.

Next, as shown in 4E, the mask layer 45 is removed.

Figure 4F:
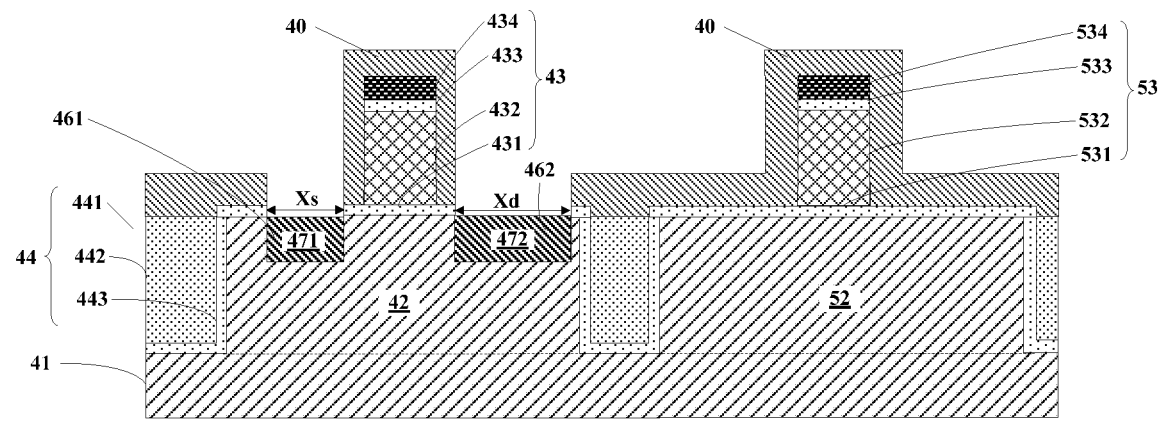

Next, as shown in FIG. 4F, for example, by means of an epitaxy process, a first source 471 is formed in the first depression 461 and a first drain 472 is formed in the second depression 462. The size Xd of the first drain 472 is larger than the size Xs of the first source 471.

A process of forming spacers and a process of forming a second source and a second drain according to an embodiment of the present invention are described below with reference to FIG. 4G to FIG. 4I.

Figure 4G:
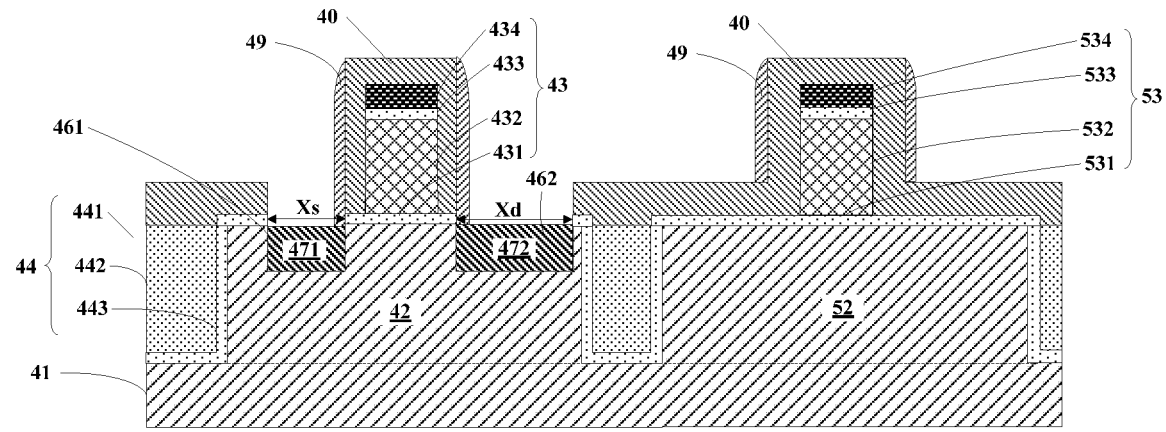

In some implementations, after the first source 471 and the first drain 472 are formed, as shown in FIG. 4G, spacers 49 are separately formed on two sides of the first gate structure 43 and on two sides of the second gate structure 53, where the spacers 49 are on a side surface of the protective layer 40. For example, a material of the spacers 49 may include silicon dioxide or silicon nitride.

Figure 4H:
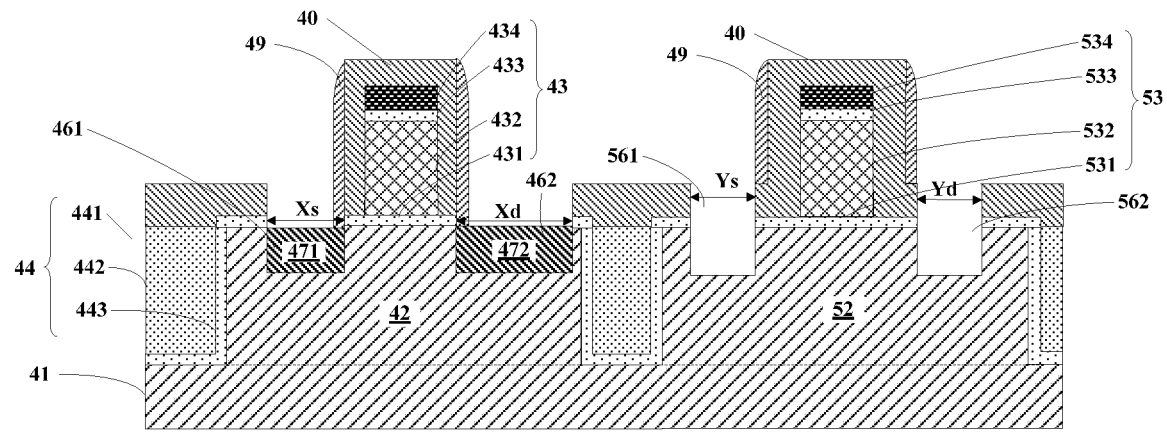

Next, as shown in FIG. 4H, after the spacers 49 are formed, the part of the protective layer 40 on two sides of the second gate structure 53 and a part of the second active region 52 are etched, thereby forming a third depression 561 and a fourth depression 562. For example, the size Yd of the fourth depression 562 is equal to the size Ys of the third depression 561. For example, the size of the third depression may include a horizontal size of the third depression along a channel direction; the size of the fourth depression may include a horizontal size of the fourth depression along the channel direction.

Figure 4I:
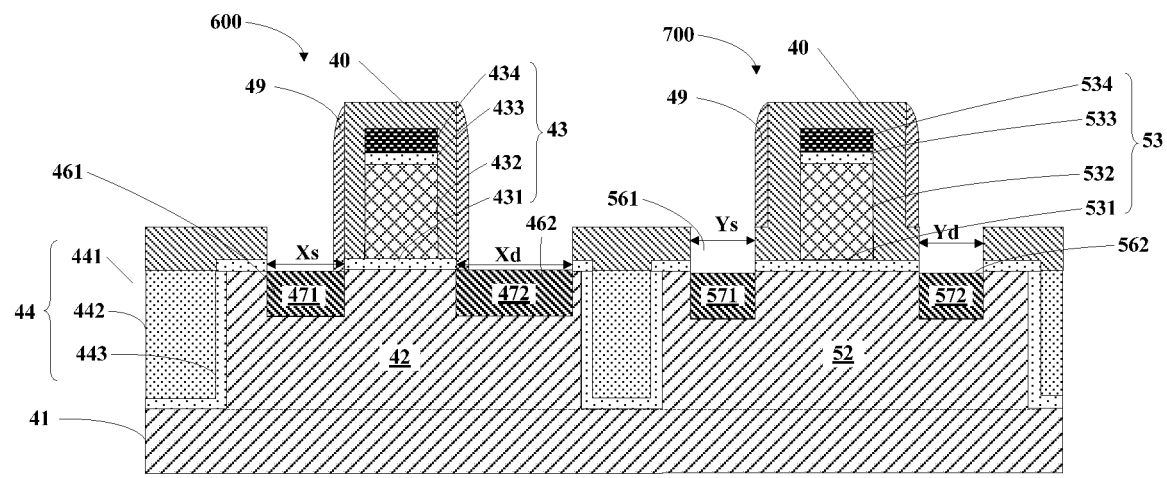

Next, as shown in FIG. 4I, for example, by means of an epitaxy process, a second source 571 is formed in the third depression 561, and a second drain 572 is formed in the fourth depression 562. In this way, the second source 571 and the second drain 572 that are on two sides of the second gate structure 53 respectively are formed in the second active region 52. For example, the size of the second drain 572 is equal to the size of the second source 571. For example, the size of the second drain may include a horizontal size of the second drain along the channel direction; the size of the second source may include a horizontal size of the second source along the channel direction.

Heretofore, forms of a manufacturing method for a semiconductor device are provided. The manufacturing method forms a first semiconductor device 600 having an asymmetric structure and a second semiconductor device 700 having a symmetric structure. The first semiconductor device 600 may be used as a PG transistor, to make a read current in an SRAM relatively low while a write current relatively high, thereby improving the read margin and the write margin. The second semiconductor device 700, for example, may be used as a PD transistor.

A process of forming spacers and a process of forming a second source and a second drain according to other implementations of the present disclosure are described below with reference to FIG. 4J to FIG. 4M.

Figure 4J:
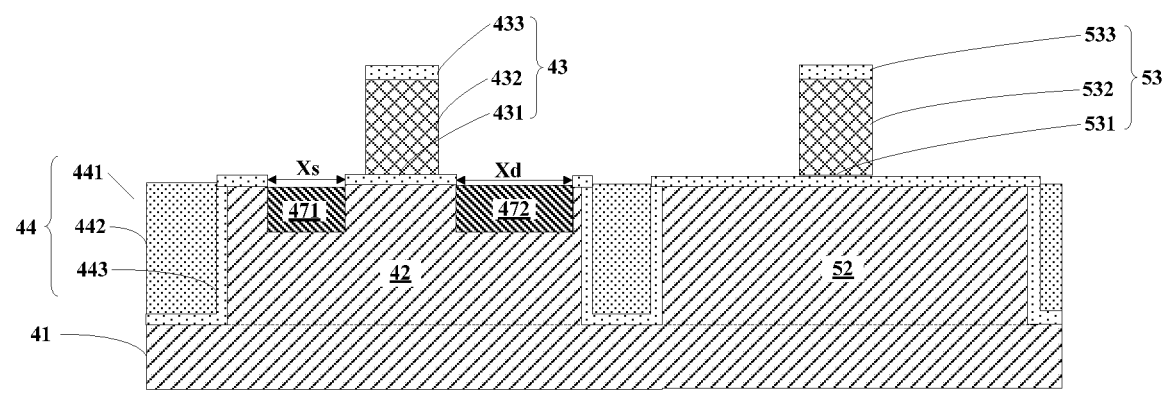

In some implementations, after the first source 471 and the first drain 472 (that is, the structure shown in FIG. 4F) are formed, as shown in FIG. 4J, the protective layer 40 is removed. In some implementations, in the step of removing the protective layer 40, the first hard mask layer 434 and the second hard mask layer 534 are further removed.

Figure 4K:
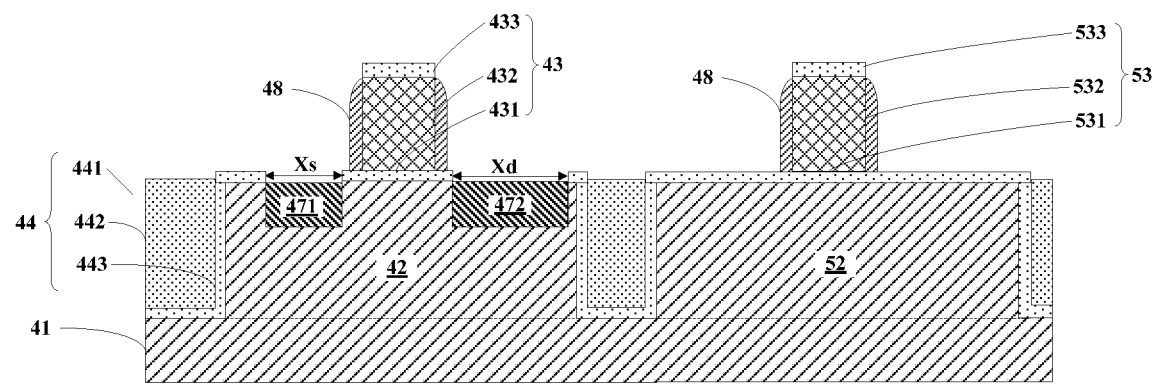

Next, as shown in FIG. 4K, spacers 48 are formed on a side surface of the first gate structure 43 (such as the first gate of the first gate structure) and on a side surface of the second gate structure 53 (such as the second gate of the second gate structure) by means of, for example, a deposition process and an etching process. For example, a material of the spacers 48 may include silicon dioxide or silicon nitride.

Figure 4L:
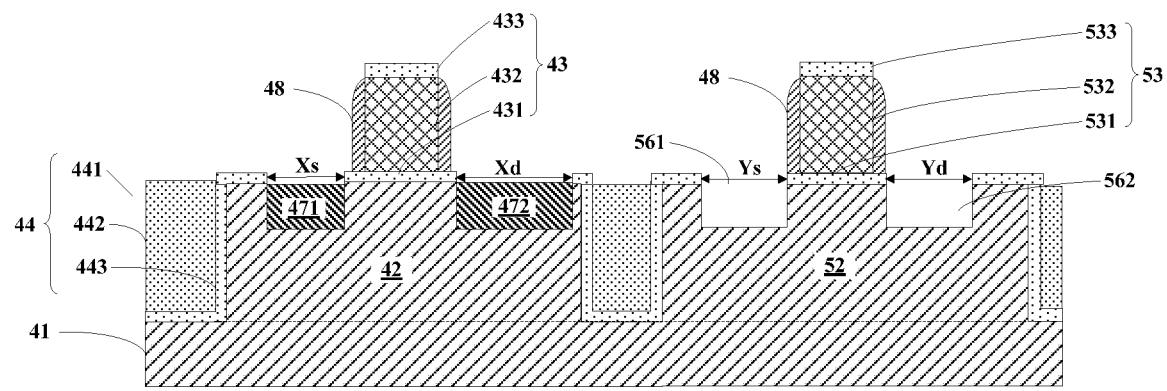

Next, as shown in FIG. 4L, a part of the second active region 52 on two sides of the second gate structure 53 is etched, thereby forming a third depression 561 and a fourth depression 562. For example, the size Yd of the fourth depression 562 is equal to the size Ys of the third depression 561.

Figure 4M:
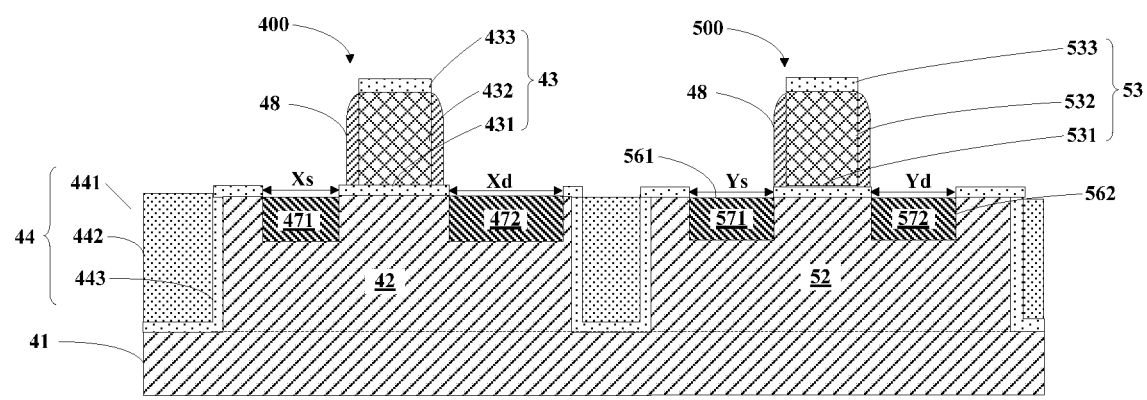

Next, as shown in FIG. 4M, for example, by means of an epitaxy process, a second source 571 is formed in the third depression 561, and a second drain 572 is formed in the fourth depression 562. In this way, the second source 571 and the second drain 572 that are on two sides of the second gate structure 53 respectively are formed in the second active region 52. For example, the size of the second drain 572 is equal to the size of the second source 571.

It should be noted that, the term "equal" here is not limited to being absolutely equal; instead, an error between the two is allowed, like adding the description "substantially" in front of the term "equal".

Heretofore, a manufacturing method for a semiconductor device according to some other forms of the present disclosure is provided. The manufacturing method forms a first semiconductor device 400 having an asymmetric structure and a second semiconductor device 500 having a symmetric structure. The first semiconductor device 400 may be used as a PG transistor, to make a read current in an SRAM relatively low while a write current relatively high, thereby improving the read margin and the write margin. The second semiconductor device 500, for example, may be used as a PD transistor.

The present disclosure further provides a semiconductor device according to another form of the present disclosure. For example, as shown in FIG. 4I, the semiconductor device may include: a substrate 41, a first active region 42, a first gate structure 43, a first source 471, and a first drain 472. These structures are the same as or similar to the substrate 31, the first active region 32, the first gate structure 33, the first source 371, and the first drain 372 in FIG. 3G respectively, and therefore are not described in detail again herein. These structures form a first semiconductor device 600. The first semiconductor device 600 may be used as a PG transistor in an SRAM.

In some implementations, as shown in FIG. 4I, the semiconductor device may further include: a second active region 52 that is on the substrate 41 and spaced from the first active region 42. For example, a conduction type of the second active region 52 may be the same as or opposite to a conduction type of the first active region 42.

As shown in FIG. 4I, the semiconductor device may further include: a second gate structure 53 on the second active region 52. For example, the second gate structure 53 may include: a second gate dielectric layer 531 on the second active region 52 and a second gate 532 on the second gate dielectric layer 531. In some implementations, the second gate structure 53 may further include: a second buffer layer 533 on the second gate 532. In some implementations, the second gate structure 53 may further include: a second hard mask layer 534 on the second buffer layer 533.

As shown in FIG. 4I, the semiconductor device may further include: a second source 571 and a second drain 572 that are in the second active region 52 and on two sides of the second gate structure 53 respectively. For example, the size of the second drain 572 is equal to the size of the second source 571. The second active region 52, the second gate structure 53, the second source 571, and the second drain 572 form a second semiconductor device 700. For example, the second semiconductor device 700 may be used as a PD transistor.

In some implementations, as shown in FIG. 4I, the semiconductor device may further include: a protective layer 40 that covers a surface of the first gate structure 43 and a surface of the second gate structure 53.

In some implementations, as shown in FIG. 4I, the semiconductor device may further include: spacers 49 that are on two sides of the first gate structure 43 and two sides of the second gate structure 53 respectively, where the spacers 49 are on a side surface of the protective layer 40.

In the foregoing implementations, the semiconductor device not only includes the first semiconductor device 600 that can be used as a PG transistor, but also includes a second semiconductor device 700 that can be used as a PD transistor. The first semiconductor device 600 may make a read current in the SRAM relatively low while a write current relatively high, thereby improving the read margin and the write margin.

In another implementation, the present disclosure further provides another semiconductor device, for example, as shown in FIG. 4M. Here, structures that are included in the semiconductor device shown in FIG. 4M and the same as or similar to those shown in FIG. 4I are not described in detail again. One of the differences between the semiconductor device shown in FIG. 4M and the semiconductor device shown in FIG. 4I is that, the semiconductor device shown in FIG. 4M does not include the protective layer 40, and the spacers are directly formed on the side surfaces on two sides of the first gate structure and the second gate structure. That is, as shown in FIG. 4M, the semiconductor device may further include: spacers 48 that are on side surfaces of the first gate structure 43 (such as the first gate of the first gate structure) and side surfaces of the second gate structure 53 (such as the second gate of the second gate structure). In addition, compared with FIG. 4I, the first gate structure 43 shown in FIG. 4M does not include the first hard mask layer 434, and the second gate structure 53 shown in FIG. 4M does not include the second hard mask layer 534.

Heretofore, embodiments and implementations of the present disclosure are described in detail. To avoid obstructing the concepts of the present disclosure, some details generally known in the art are not described. According to the foregoing descriptions, a person skilled in the art may completely understand how to implement the technical solutions disclosed herein.

Some specific embodiments and implementations of the present disclosure are described in detail through examples. However, a person skilled in the art will understand that the foregoing examples are merely for illustration, and are not intended to limit the scope of the present disclosure. A person skilled in the art will understand that the foregoing embodiments and implementations may be modified without departing from the scope and spirit of the present disclosure. The scope of the present invention is defined by the appended claims.

The invention claimed is:

1. A semiconductor device, comprising:
a substrate;
a first active region on the substrate;
a first gate structure on the first active region, where the first gate structure comprises a first gate dielectric layer positioned on the first active region, a first gate positioned on the first gate dielectric layer, and a first buffer layer positioned on the first gate;
a first source and a first drain positioned in the first active region, where the first source and the first drain are respectively on two sides of the first gate structure, the first gate structure is not positioned directly above any portion of the first source nor the first drain, and a top surface of the first source is level with and directly next to a bottom surface of the first gate dielectric layer without an intervening structure between the top surface of the first source and the bottom surface of the first gate dielectric layer, where a top surface of the first drain is level with and directly next to the bottom surface of the first gate dielectric layer without an intervening structure between the top surface of the first drain and the bottom surface of the first gate dielectric layer; and
two spacers respectively positioned on side surfaces on two sides of the first gate without contacting surfaces of the first buffer layer, positioned directly above the first gate dielectric layer, and abutting against a top surface of the first gate dielectric layer without covering end top surfaces of the first gate dielectric layer at both ends of the first gate dielectric layer, side surfaces of the two spacers only contacting the first gate;
wherein a size of the first drain is larger than a size of the first source, the size of the first drain comprises a horizontal size of a portion of the first drain exposed on a top surface of the first active region along a channel direction and the size of the first source comprises a horizontal size of a portion of the first source exposed on the top surface of the first active region along the channel direction.

2. The semiconductor device according to claim 1, wherein,
a conduction type of the first active region is N type, and a material of the first source and a material of the first drain comprises silicon germanium; or
a conduction type of the first active region is P type, and a material of the first source and a material of the first drain comprises silicon carbide.

3. The semiconductor device according to claim 1, further comprising:
a second active region that is positioned on the substrate and that is spaced from the first active region;
a second gate structure positioned on the second active region; and
a second source and a second drain that are positioned in the second active region and are respectively positioned on two sides of the second gate structure;
wherein a size of the second drain is equal to a size of the second source.

4. The semiconductor device according to claim 3, wherein the second gate structure comprises:
a second gate dielectric layer positioned on the second active region, and
a second gate positioned on the second gate dielectric layer.

* * * * *